(12) United States Patent
Park et al.

(10) Patent No.: US 8,455,933 B2
(45) Date of Patent: Jun. 4, 2013

(54) IMAGE SENSOR USING LIGHT-SENSITIVE TRANSPARENT OXIDE SEMICONDUCTOR MATERIAL

(75) Inventors: Sung-ho Park, Gyeonggi-do (KR); I-hun Song, Yongin-si (KR); Ji-hyun Hur, Yongin-si (KR); Sang-hun Jeon, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 2979 days.

(21) Appl. No.: 12/801,392

(22) Filed: Jun. 7, 2010

(65) Prior Publication Data

US 2011/0156114 A1 Jun. 30, 2011

(30) Foreign Application Priority Data

Dec. 29, 2009 (KR) .................. 10-2009-0132825

(51) Int. Cl.
*H01L 31/062* (2006.01)

(52) U.S. Cl.
USPC ........... 257/291; 257/292; 257/293; 257/294; 257/E31.127

(58) Field of Classification Search
USPC ................. 257/291, 292, 293, 294, E31.127
See application file for complete search history.

(56) References Cited

U.S. PATENT DOCUMENTS

| | | |
|---|---|---|
| 2004/0173795 A1 | 9/2004 | Moon et al. |
| 2005/0162579 A1 | 7/2005 | Jeong et al. |
| 2006/0108529 A1 | 5/2006 | Saito et al. |
| 2009/0218572 A1 | 9/2009 | Dairiki et al. |
| 2009/0294812 A1 | 12/2009 | Gambino et al. |
| 2010/0097838 A1* | 4/2010 | Tanaka et al. .................. 365/112 |
| 2010/0157117 A1* | 6/2010 | Wang ............................. 348/276 |
| 2011/0057185 A1* | 3/2011 | Peng et al. ........................ 257/43 |

FOREIGN PATENT DOCUMENTS

| | | |
|---|---|---|
| EP | 2 012 368 | 1/2009 |
| JP | 2003-298062 | 10/2003 |
| JP | 2003-332551 A | 11/2003 |
| JP | 2004-119525 | 4/2004 |
| JP | 2004-165242 A | 6/2004 |
| JP | 2004-342783 A | 12/2004 |
| JP | 2005-268471 A | 9/2005 |
| JP | 2006-165530 | 6/2006 |
| KR | 10-0889365 A | 12/2005 |
| KR | 10-2006-0065551 A | 6/2006 |
| KR | 10-0898471 B1 | 5/2009 |
| WO | WO 2007/032632 | 3/2007 |
| WO | WO 2007/120010 | 10/2007 |

OTHER PUBLICATIONS

Kenji Nomura, et al., "Room-temperature fabrication of transparent flexible thin-film transistors using amorphous oxide semiconductors", Nature Publishing Group, Letters to Nature, vol. 432, pp. 488-492, Nov. 25, 2004.
European Extended Search Report dated Aug. 20, 2012.

* cited by examiner

*Primary Examiner* — Tan N Tran
(74) *Attorney, Agent, or Firm* — Harness, Dickey & Pierce, P.L.C.

(57) ABSTRACT

An image sensor according to example embodiments may include a plurality of light-sensitive transparent oxide semiconductor layers as light-sensing layers. The light-sensing layers may be stacked in one unit pixel region.

34 Claims, 14 Drawing Sheets

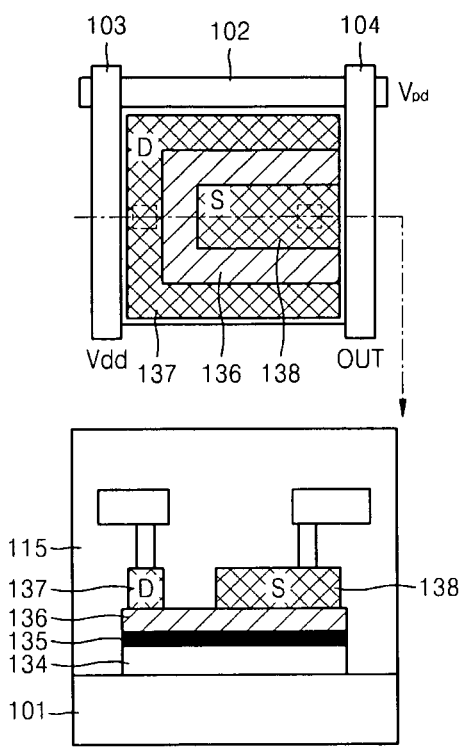

IMAGE SENSOR USING LIGHT-SENSITIVE TRANSPARENT OXIDE SEMICONDUCTOR MATERIAL

CROSS-REFERENCE TO RELATED APPLICATION

This application claims priority under 35 U.S.C. §119 to Korean Patent Application No. 10-2009-0132825, filed on Dec. 29, 2009 with the Korean Intellectual Property Office, the disclosure of which is incorporated herein in its entirety by reference.

BACKGROUND

1. Field

Example embodiments relate to an image sensor using a light-sensitive transparent oxide semiconductor material, e.g., an image sensor using a light-sensitive transparent oxide semiconductor transistor as a light-sensing layer.

2. Description of the Related Art

Complimentary metal oxide semiconductor (CMOS) image sensors, which are solid state image pickup devices using a CMOS, and charge-coupled device (CCD) image sensors are similar to each other in that both of the image sensors use a photodiode, but are different from each other with respect to a manufacturing method and a method of reading a signal. In general, a CMOS image sensor includes a photodiode and a transistor at each unit pixel, and thus may capture an image by sequentially detecting electrical signals generated by each unit pixel in a switching mode. The CMOS image sensor has advantages in that because the CMOS image sensor may be mass produced by using a general semiconductor manufacturing device, the CMOS image sensor has lower manufacturing costs than the CCD image sensor, and because the size of the CMOS image sensor is smaller than the CCD image sensor, the CMOS image sensor has lower power consumption than the CCD image sensor. Also, the CMOS image sensor has other advantages in that the CMOS image sensor may be manufactured along with a plurality of signal processing devices in one chip. Although the CMOS image sensor at an initial stage has a disadvantage in that, because amplifiers are respectively allocated to pixels, noise is generated in the CMOS image sensor due to a difference between characteristics of the amplifiers, a signal to noise ratio (SNR) has been greatly increased due to various technical improvements.

In recent years, research has been conducted into a micro process for manufacturing the CMOS image sensor. If the size of a chip is reduced by using the micro process and the CMOS image sensor is able to maintain the same number of pixels, more image sensors may be produced from one wafer. As a result, the unit cost of the CMOS image sensor may be reduced, production of the CMOS image sensors may be increased, the size of a camera module including the CMOS image sensor may be reduced, and a camera phone including the camera module may be easily made compact and thin. A technology of forming a unit pixel having a size of about 1.4 μm has been established so far, and about 12.25 million pixels may be formed from a 1/2.5 inch chip.

SUMMARY

Example embodiments include an image sensor that may reduce the size of a unit pixel by using a light-sensitive transparent oxide semiconductor material as a light-sensing layer. Additional aspects will be set forth in the description which follows and may be apparent from the description or may be learned by practice of the various non-limiting embodiments.

An image sensor according to example embodiments may include at least one light-sensitive oxide semiconductor layer as a light-sensing layer. The at least one light-sensitive oxide semiconductor layer may include a plurality of light-sensing layers stacked on different levels. In a non-limiting embodiment, the at least one light-sensitive oxide semiconductor layer may include a plurality of light-sensing layers stacked in one unit pixel region.

The image sensor may further include a first filter layer and a second filter layer, wherein the at least one light-sensitive oxide semiconductor layer includes a first light-sensing layer, a second light-sensing layer, and a third light-sensing layer, and the first light-sensing layer, first filter layer, second light-sensing layer, second filter layer, and third light-sensing layer may be sequentially stacked from a side of the image sensor on which light is incident. The image sensor may further include transparent insulating layers disposed between the first light-sensing layer and the second light-sensing layer and between the second light-sensing layer and the third light-sensing layer.

The at least one light-sensitive oxide semiconductor layer constituting the light-sensing layer may be included in a light-sensitive transparent oxide semiconductor transistor having electrical characteristics that vary according to an amount of incident light. The light-sensitive transparent oxide semiconductor transistor may be used in the image sensor according to example embodiments.

The light-sensitive transparent oxide semiconductor transistor may include a substrate; a gate electrode on the substrate; a gate insulating layer on the gate electrode; the at least one light-sensitive oxide semiconductor layer on the gate insulating layer; and a drain electrode and a source electrode on the at least one light-sensitive oxide semiconductor layer.

The at least one light-sensitive oxide semiconductor layer may have light-transmitting properties. For instance, the at least one light-sensitive oxide semiconductor layer may be transparent. In a non-limiting embodiment, the at least one light-sensitive oxide semiconductor layer may be formed of indium zinc oxide (InZnO) or gallium indium zinc oxide (GaInZnO). Each of the gate electrode, the drain electrode, and the source electrode may be formed of indium tin oxide (ITO) or indium zinc oxide (IZO).

Each of the drain electrode and the source electrode may have a straight bar shape, and the drain electrode and the source electrode may be arranged in parallel on opposite sides of the light-sensitive oxide semiconductor layer. Alternatively, the drain electrode may be formed along a periphery of the at least one light-sensitive oxide semiconductor layer so as to surround the source electrode. In another non-limiting embodiment, the drain electrode may be formed along three sides of the at least one light-sensitive oxide semiconductor layer so as to partially enclose the source electrode.

The light-sensitive transparent oxide semiconductor transistor may also include a substrate; the at least one light-sensitive oxide semiconductor layer on the substrate; a gate insulating layer on the at least one light-sensitive oxide semiconductor layer; a gate electrode on the gate insulating layer; and a drain electrode and a source electrode on the at least one light-sensitive oxide semiconductor layer. The gate insulating layer may be partially disposed on the at least one light-sensitive oxide semiconductor layer.

The drain electrode may be formed along a periphery of the at least one light-sensitive oxide semiconductor layer, and the gate electrode may be formed along an inner perimeter of the drain electrode so as to surround the source electrode. Alternatively, the drain electrode may be formed along three sides of the at least one light-sensitive oxide semiconductor layer, and the gate electrode may be formed along an inner boundary of the drain electrode so as to partially enclose the source electrode.

The image sensor may further include a gate signal line connected to gate electrodes of a plurality of the light-sensitive transparent oxide semiconductor transistors, a power line connected to drain electrodes of the plurality of light-sensitive transparent oxide semiconductor transistors, and output lines connected to source electrodes of the plurality of light-sensitive transparent oxide semiconductor transistors.

The image sensor may further include a lens device on the first light-sensing layer. The lens device may focus blue light on the first light-sensing layer, focus green light on the second light-sensing layer, and focus red light on the third light-sensing layer by using chromatic aberration.

The first filter layer may block light having blue wavelengths and transmit light having wavelengths other than the blue wavelengths, and the second filter layer may block light having green wavelengths and transmit light having wavelengths other than the green wavelengths or transmit light having red wavelengths and block light having wavelengths other than the red wavelengths. Each of the first and second filter layers may include a light absorption layer having a light absorption coefficient that varies according to wavelength.

The light absorption layer may include any one of amorphous silicon, crystalline silicon, Ge, GaAs, and $Ga_xIn_yS_2P$. The light absorption layer of the first filter layer may be thinner than the light absorption layer of the second filter layer. The first filter layer may be a blue complementary color filter that blocks light having blue wavelengths and transmits light having green and red wavelengths, and the second filter layer may be a green complementary color filter that blocks light having green wavelengths and transmits light having blue and red wavelengths or is a red filter that transmits only light having red wavelengths. The first filter layer may be formed of any one of $TiO_x$, $SiO_x$, $Fe_2O_3$, cobalt (Co)-doped $ZnO_x$, and Co-doped $Al_2O_3$, and the second filter layer may be formed of any one of $TiO_x$, $SiO_x$, $Fe_2O_3$, Co-doped $ZnO_x$, and Co-doped $Al_2O_3$.

The image sensor may further include a plurality of image sensor cells arranged in a two-dimensional (2-D) manner, wherein each of the plurality of image sensor cells includes a substrate; the light-sensing layer on the substrate; and a filter layer on the light-sensing layer. The plurality of image sensor cells may be disposed in one unit pixel and may include different color filters as filter layers.

The light-sensing layer may be included in a light-sensitive transparent oxide semiconductor transistor having electrical characteristics that vary according to an amount of incident light. The light-sensitive transparent oxide semiconductor transistor may include a gate electrode on the substrate; a gate insulating layer on the gate electrode; the light-sensing layer on the gate insulating layer; and a drain electrode and a source electrode on the light-sensing layer.

BRIEF DESCRIPTION OF THE DRAWINGS

The above and/or other aspects of example embodiments may become more apparent and readily appreciated when the following description is taken in conjunction with the accompanying drawings of which:

FIGS. 12A through 12F are plan views and cross-sectional views illustrating various non-limiting light-sensitive transparent oxide semiconductor transistors that may be used in the image sensor of FIG. 1;

DETAILED DESCRIPTION

Figure 1:
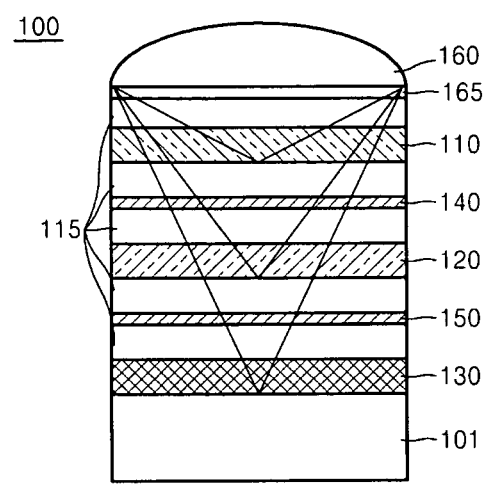
FIG. 1 is a cross-sectional view of an image sensor using a light-sensitive transparent oxide semiconductor material as a light-sensing layer according to example embodiments.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Reference will now be made in further detail to various non-limiting embodiments, examples of which are illustrated in the accompanying drawings. In the drawings, like reference numerals denote like elements, and the sizes of elements may have been exaggerated for clarity.

FIG. 1 is a cross-sectional view of an image sensor 100 using a light-sensitive transparent oxide semiconductor material as a light sensor (e.g., light-sensing layer) according to example embodiments. Referring to FIG. 1, the image sensor 100 may be constructed in such a manner that a plurality of, for example, first through third, light-sensing layers 110, 120, and 130 are stacked on different layers over a substrate 101 in one pixel cell. Although the first through third light-sensing layers 110, 120, and 130 are illustrated in FIG. 1, it should be understood that two or four or more light sensors may be stacked according to a color detection method that is to be used.

In further detail, referring to FIG. 1, the image sensor 100 may include a first transparent insulating layer 115, the first light-sensing layer 110, a second transparent insulating layer 115, a first filter layer 140, a third transparent insulating layer 115, the second light-sensing layer 120, a fourth transparent insulating layer 115, a second filter layer 150, a fifth transparent insulating layer 115, and the third light-sensing layer 130 sequentially disposed from a side of the image sensor 100 on which light is incident. Stated more clearly, the third light-sensing layer 130, the fifth transparent insulating layer 115, the second filter layer 150, the fourth transparent insulating layer 115, the second light-sensing layer 120, the third transparent insulating layer 115, the first filter layer 140, the second transparent insulating layer 115, the first light-sensing layer 110, and the first transparent insulating layer 115 may be sequentially stacked on the substrate 101. A lens device 160 may be further disposed on the first transparent insulating layer 115 by using an adhesive layer 165. For instance, the image sensor 100 may be constructed in such a way that the first through fifth transparent insulating layers 115 are disposed in an alternating manner between the three light-sensing layers 110, 120, and 130, and the first and second filter layers 140 and 150 are respectively disposed between the second and third transparent insulating layers 115 and between the fourth and fifth transparent insulating layers 115. Each of the first through fifth transparent insulating layers 115 may be formed of a transparent insulating material (e.g., $SiO_2$).

Light incident on the image sensor 100 constructed as described above may be detected by the first through third light-sensing layers 110, 120, and 130 with respect to color components of the light. For example, the first light-sensing layer 110 may detect all of red, green, and blue light. Part of the light incident on the image sensor 100 travels toward the second light-sensing layer 120. For example, the first filter layer 140 may block only light having blue wavelengths and transmit light having wavelengths other than the blue wavelengths. Accordingly, the second light-sensing layer 120 may detect mostly red and green light. Part of the light passing through the second light-sensing layer 120 travels toward the third light-sensing layer 130. The second filter layer 150 may block only light having green wavelengths and transmit light having wavelengths other than the green wavelengths. Alternatively, the second filter layer 150 may transmit only light having red wavelengths and block light having wavelengths other than the red wavelengths. Accordingly, the third light-sensing layer 130 may detect mostly red light. Accordingly, intensities of red, green, and blue light may be exactly calculated by considering intensities of the light detected by the first through third light-sensing layers 110, 120, and 130 and a light loss factor after the light travels through the first through third light-sensing layers 110, 120, and 130.

Improved color separation may be achieved by using chromatic aberration of the lens device 160. In general, the index of refraction increases as a wavelength decreases. A refractive power, which is a measurement of how much light is refracted with respect to a wavelength thereof, may vary according to a refractive index of a material of the lens device 160 and a curvature of a lens surface. Accordingly, if the lens device 160 is formed of an appropriate material and the lens surface has an appropriate curvature, blue light may be focused on the first light-sensing layer 110, green light may be focused on the second light-sensing layer 120, and red light may be focused on the third light-sensing layer 130, so that specific colors may be respectively detected by the first through third light-sensing layers 110, 120, and 130.

Because the image sensor 100 includes the first through third light-sensing layers 110, 120, and 130 stacked over each other, the image sensor 100 may reduce the size of one pixel beyond existing size limitations. For example, a conventional CMOS image sensor includes a plurality of light sensors arranged on one layer wherein four photodiodes arranged in a square shape form one pixel. Two photodiode cells form a green cell in one diagonal direction, and the two other diagonal photodiode cells form a red cell and a blue cell in the other diagonal direction. Accordingly, even though the size of each of the photodiodes may be reduced and the size of a driving circuit for driving the photodiodes may be reduced, there is a limitation in reducing the size of a pixel due to limitations in size according to the current integration technology. On the other hand, because the image sensor 100 of FIG. 1 allows one cell to include the first through third light-sensing layers 110, 120, and 130, which are stacked to form one pixel, the size of a pixel may be less than that of the conventional CMOS image sensor.

To stack the first through third light-sensing layers 110, 120, and 130, light sensors in the light-sensing layers 110, 120, and 130 may have light-transmitting properties. Examples of materials for the light sensors having light-transmitting properties may include a light-sensitive transparent oxide semiconductor material. For example, a light-sensitive transparent oxide semiconductor transistor that uses a light-sensitive transparent oxide semiconductor as a channel material may be characterized in that a threshold voltage or the like varies according to a wavelength of light or the amount of light.

Figure 2:
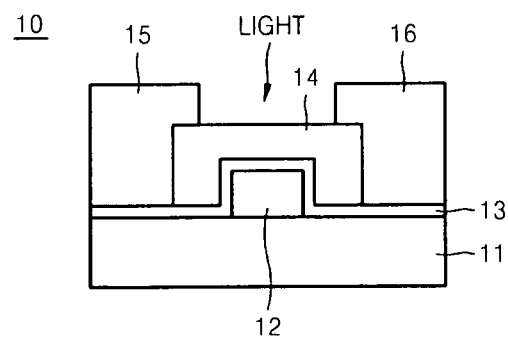
FIG. 2 is a cross-sectional view of a light-sensitive transparent oxide semiconductor transistor that may be used in the image sensor of FIG. 1.

FIG. 2 is a cross-sectional view illustrating a light-sensitive transparent oxide semiconductor transistor 10 that may be used in the image sensor 100 according to example embodiments. Referring to FIG. 2, the light-sensitive transparent oxide semiconductor transistor 10 may include a transparent substrate 11, a gate electrode 12 partially formed on the transparent substrate 11, a gate insulating layer 13 formed to cover the transparent substrate 11 and the gate electrode 12, an oxide semiconductor layer 14 covering the gate insulating layer 13, and a drain electrode 15 and a source electrode 16 formed on opposite sides of the oxide semiconductor layer 14. Each of the gate electrode 12, the drain electrode 15, and the source electrode 16 may be formed of a transparent conductive material, e.g., indium tin oxide (ITO) or indium zinc oxide (IZO). The gate insulating layer 13 may be formed of a transparent insulating material, e.g., $SiO_2$. The oxide semiconductor layer 14 may function as a channel region and may be formed of a light-sensitive transparent oxide, e.g., indium zinc oxide (InZnO) or gallium indium zinc oxide (GaInZnO).

Figure 3:
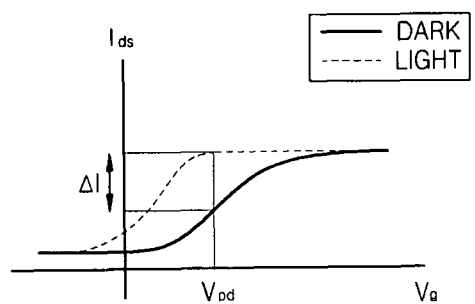
FIG. 3 is a graph illustrating operational characteristics of the light-sensitive transparent oxide semiconductor transistor of FIG. 2.

FIG. 3 is a graph illustrating operational characteristics of the light-sensitive transparent oxide semiconductor transistor 10 of FIG. 2. Referring to FIG. 3, as the amount of incident light increases, a threshold voltage decreases and an output current increases by Δ1 at the same gate voltage $V_{pd}$. Accordingly, transparent light sensors disposed in the first through third light-sensing layers 110, 120, and 130 of the image sensor 100 of FIG. 1 may be realized having the operational characteristics illustrated in FIG. 3 by using the light-sensitive transparent oxide semiconductor transistor 10.

Figure 4:
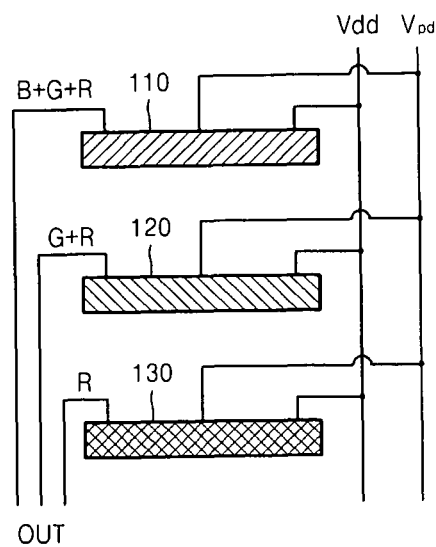
FIG. 4 is a conceptual view of the image sensor of FIG. 1 using the light-sensitive transparent oxide semiconductor transistor of FIG. 2.
Figure 5:
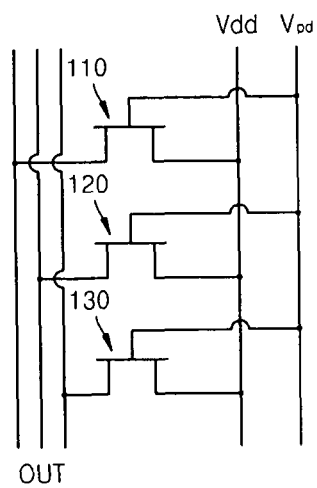
FIG. 5 is a circuit diagram of FIG. 4.

FIG. 4 is a conceptual view of the image sensor 100 of FIG. 1 using the light-sensitive transparent oxide semiconductor transistor 10 of FIG. 2 for each of the first through third light-sensing layers 110, 120, and 130. FIG. 5 is a circuit diagram of FIG. 4. Referring to FIGS. 4 and 5, a power line for applying a driving voltage $V_{pd}$ to the light-sensitive transparent oxide semiconductor transistor 10 and a gate signal line for selecting an output may be commonly connected to the first through third light-sensing layers 110, 120, and 130. For example, the power line may be connected to a drain electrode of the light-sensitive transparent oxide semiconductor transistor 10, and the gate signal line may be connected to a gate electrode of the light-sensitive transparent oxide semiconductor transistor 10. To obtain an output indicating light intensity from the light-sensitive transparent oxide semiconductor transistor 10, three output lines OUT may be respectively connected to the first through third light-sensing layers 110, 120, and 130. For example, each of the output lines OUT may be connected to a source electrode of the light sensitive transparent oxide semiconductor transistor 10.

In the configuration of FIGS. 4-5, if a voltage is applied to the gate signal line under the control of a driving circuit (not shown), current begins to flow through the output lines OUT connected to the first through third light-sensing layers 110, 120, and 130. The amount of current flowing through each of the output lines OUT varies according to respective intensities of light incident on the first through third light-sensing layers 110, 120, and 130. As described above, an output from the first light-sensing layer 110 may indicate intensities of red, green, and blue light. An output from the second light-sensing layer 120 may indicate intensities of mostly red and green light. An output from the third light-sensing layer 130 may indicate an intensity of mostly red light. Accordingly, by using the outputs from the first through third light-sensing layers 110, 120, and 130, the intensities of the red, green, and blue light included in the incident light may be exactly calculated as will be described later in detail.

Figure 6:
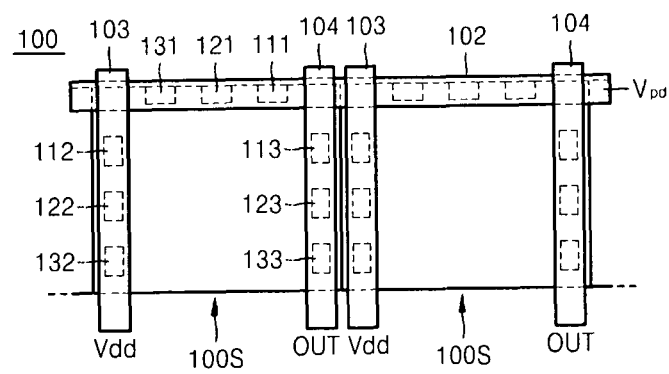
FIG. 6 illustrates a plurality of image sensor cells of the image sensor of FIG. 1.

FIG. 6 illustrates a plurality of image sensor cells 100S of the image sensor 100 of FIG. 1. As described above, the image sensor 100 may be constructed in such a way that one image sensor cell 100S including the first through third light-sensing layers 110, 120, and 130, which are stacked, forms one pixel. Referring to FIG. 6, the plurality of image sensor cells 100S, each forming one pixel, may be arranged adjacently. Although two image sensor cells 100S are illustrated in FIG. 6 for convenience of explanation, it should be understood that more image sensor cells 100S may be arranged in a two-dimensional (2-D) manner. Each of the plurality of image sensor cells 100S may have the structure illustrated in the cross-sectional view of FIG. 1.

Referring to FIG. 6, a gate signal line 102, a power line 103, and an output line 104 may be disposed around each of the image sensor cells 100S, and a plurality of contacts 111, 112, 113, 121, 122, 123, 131, 132, and 133 for electrical connection between the gate signal line 102, the power line 103, and the output line 104 and the light-sensitive transparent oxide semiconductor transistors 10 in the first through third light-sensing layers 110, 120, and 130 may be formed on edges of the image sensor cells 100S.

For example, the gate signal line 102 may be connected to the first through third gate contacts 111, 121, and 131. Although it is shown that the first through third gate contacts 111, 121, and 131 are formed on the same layer in FIG. 6, the first through third gate contacts 111, 121, and 131 may be respectively formed on the first through third light-sensing layers 110, 120, and 130. The first through third gate contacts 111, 121, and 131 and the gate signal line 102 may be electrically connected to each other through via holes (not shown). Likewise, the power line 103 is electrically connected to the first through third power contacts 112, 122, and 132. The first through third power contacts 112, 122, and 132 may be respectively formed on the first through third light-sensing layers 110, 120, and 130, and may be electrically connected to the power line 103 through via holes (not shown).

Although one output line 104 is illustrated for one image sensor cell 100S in FIG. 6, three output lines 104 actually exist to correspond to the first through third light-sensing layers 110, 120, and 130. Stated more clearly, three output lines 104 may be respectively formed on the first through third light-sensing layers 110, 120, and 130. The first through third output contacts 113, 123, and 133 electrically connected to the output lines 104 may be respectively formed on the first through third light-sensing layers 110, 120, and 130. Accordingly, the first through third output contacts 113, 123, and 133 may be electrically connected to the output lines 104 respectively formed on the first through third light-sensing layers 110, 120, and 130.

To enable the first through third light-sensing layers 110, 120, and 130 to detect light having different wavelengths, the first and second filter layers 140 and 150 may be used to block light having specific wavelengths as described above. For example, the first filter layer 140 may block only light having blue wavelengths and transmit light having wavelengths other than the blue wavelengths. The second filter layer 150 may block only light having green wavelengths and transmit light having wavelengths other than the green wavelengths. Alternatively, the second filter layer 150 may transmit only light having red wavelengths and block light having wavelengths other than the red wavelengths. The first and second filter layers 140 and 150 may be realized by using a light absorption adjustment layer or by using a complementary color filter layer.

Figure 7:
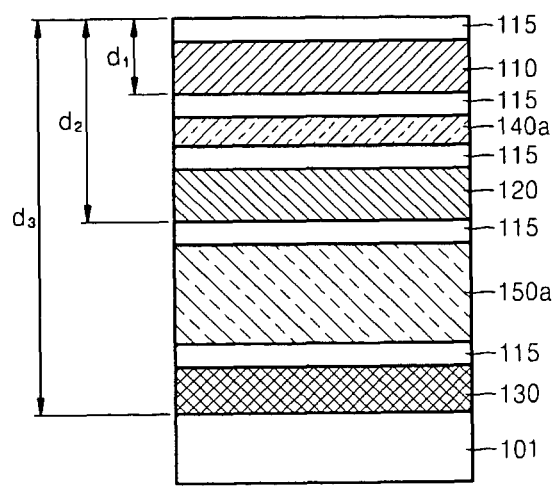
FIG. 7 is a cross-sectional view of the image sensor of FIG. 1, illustrating a non-limiting embodiment where a light absorption adjustment layer is disposed between light-sensing layers.

FIG. 7 is a cross-sectional view of the image sensor 100 of FIG. 1, illustrating a non-limiting embodiment where a first light absorption adjustment layer 140a is disposed as the first filter layer 140 between the first light-sensing layer 110 and the second light-sensing layer 120 and a second light absorption adjustment layer 150a is disposed as the second filter layer 150 between the second light-sensing layer 120 and the third light-sensing layer 130. Each of the first and second light absorption adjustment layers 140a and 150a may use a light absorption material that has a light absorption coefficient that varies according to wavelength. For example, amorphous silicon (a-Si) may have a light absorption coefficient that is about 1000 times greater for blue wavelengths than the same for red wavelengths. Accordingly, if amorphous silicon having an appropriate thickness is selected, only light having a specific wavelength may be selectively blocked. Instead of amorphous silicon, a light absorption material, e.g., crystalline silicon, Ge, GaAs, $Ga_xIn_yS_2P$, may be used for the first and second light absorption adjustment layers 140a and 150a.

Referring to FIG. 7, a thickness of the first light absorption adjustment layer 140a may be different from a thickness of the second light absorption adjustment layer 150a. In order to block only light having blue wavelengths, the first light absorption adjustment layer 140a may be relatively thin. On the other hand, in order to block light having blue and green wavelengths and transmit only light having red wavelengths, the second light absorption adjustment layer 150a may be relatively thick. For example, if each of the first and second light absorption adjustment layers 140a and 150a is formed of amorphous silicon, a thickness $d_1$ between an uppermost surface and the first light-sensing layer 110 may be about 0.2 μm, a thickness $d_2$ between the uppermost surface and the second light-sensing layer 120 may be about 0.6 μm, and a thickness $d_3$ between the uppermost surface and the third light-sensing layer 130 may be about 2 μm. The first through third light-sensing layers 110, 120, and 130 may each have the same thickness, and the first through fifth transparent insulating layers 115 may each have the same thickness. In this case, wavelengths of light that are to be incident on each of the first through third light-sensing layers 110, 120, and 130 may be selected by adjusting the thicknesses of the first light absorption adjustment layer 140a and the second light absorption adjustment layer 150a.

Figure 8:
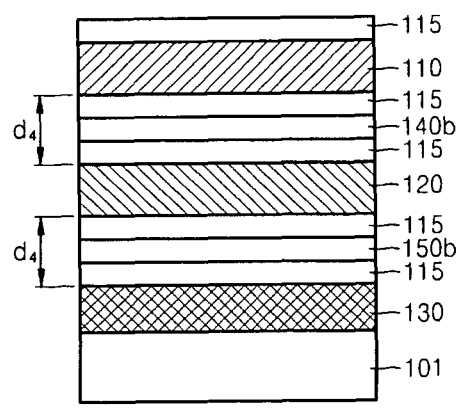
FIG. 8 is a cross-sectional view of the image sensor of FIG. 1, illustrating a non-limiting embodiment where a complementary color filter layer is disposed between light-sensing layers.

FIG. 8 is a cross-sectional view of the image sensor 100 of FIG. 1, illustrating a non-limiting embodiment where a first complementary color filter layer 140b is disposed as the first filter layer 140 between the first light-sensing layer 110 and the second light-sensing layer 120 and a second complementary color filter layer 150b is disposed as the second filter layer 150 between the second light-sensing layer 120 and the third light-sensing layer 130. A complementary color filter is a filter that blocks light having specific wavelengths and transmits light having wavelengths other than the specific wavelengths. For example, a blue complementary color filter may block light having blue wavelengths and transmit light having wavelengths other than the blue wavelengths. Because there is little connection between thicknesses and transmission/blocking characteristics of a complementary color filter, a thickness $d_4$ between the first light-sensing layer 110 and the second light-sensing layer 120 and a thickness between the second light-sensing layer 120 and the third light-sensing layer 130 may be the same. For example, the thickness $d_4$ may be about 0.2 μm.

The first complementary color filter layer 140b may be a blue complementary color filter that blocks only light having blue wavelengths and transmits light having green and red wavelengths. The second complementary color filter layer 150b may be a green complementary color filter that blocks only light having green wavelengths and transmits light having blue and red wavelengths. Alternatively, a red filter for transmitting only light having red wavelengths may be used as the second filter layer 150 as described above. A complementary color filter may be an organic filter or an inorganic filter. The inorganic filter may be formed of $TiO_x$, $SiO_x$, $Fe_2O_3$, cobalt (Co)-doped $ZnO_x$, or Co-doped $Al_2O_3$.

Figure 9:
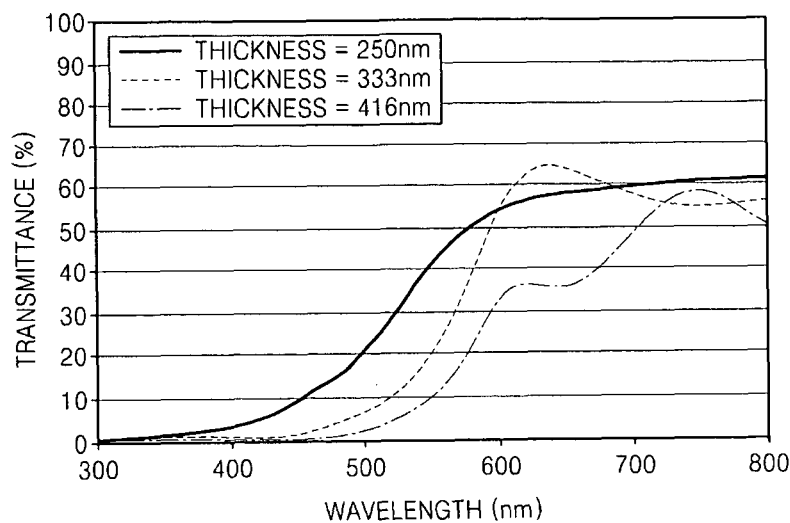
FIGS. 9 and 10 are graphs illustrating light transmittances of complementary color filter layers for the image sensor of FIG. 8.
Figure 10:
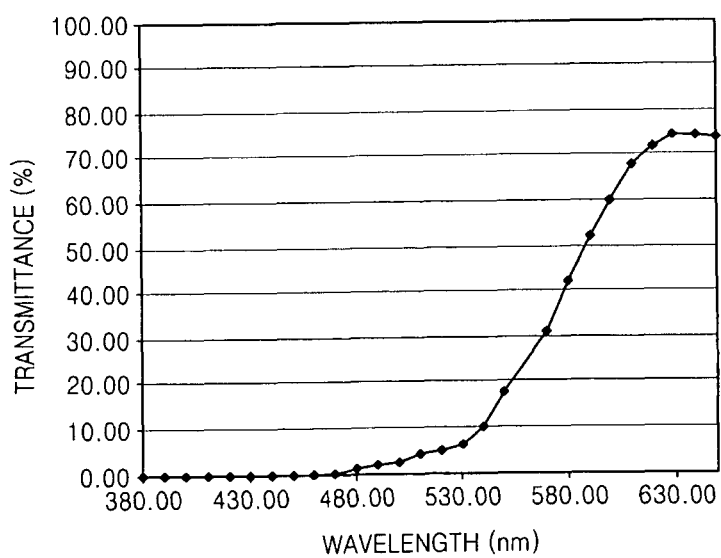

FIGS. 9 and 10 are graphs illustrating light transmittances of complementary color filter layers for the image sensor of FIG. 8. FIG. 9 is a graph illustrating a light transmittance of $Fe_2O_3$. Referring to FIG. 9, $Fe_2O_3$ may be used as a blue complementary color filter for blocking light having blue wavelengths. $Fe_2O_3$ may be used as the first filter layer 140 (e.g., first complementary color filter layer 140b). FIG. 10 is a graph illustrating a light transmittance of Co-doped $Al_2O_3$. Referring to FIG. 10, Co-doped $Al_2O_3$ may be used as a filter transmitting mostly light having red wavelengths. Co-doped $Al_2O_3$ may be used as the second filter layer 150 (e.g., second complementary color filter layer 150b).

Figure 11A:
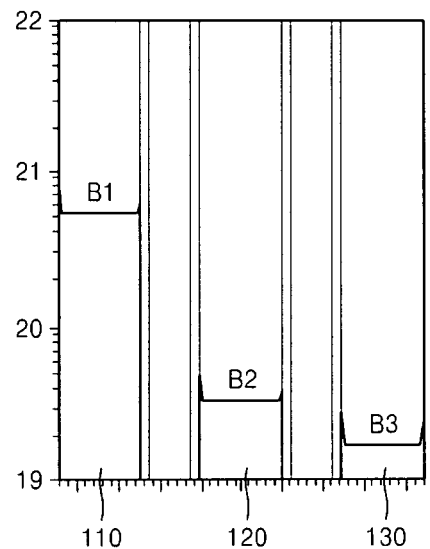
FIGS. 11A through 11C illustrating photoelectron generation rates at a plurality of light-sensing layers according to wavelengths of light incident on the image sensor of FIG. 1.
Figure 11B:
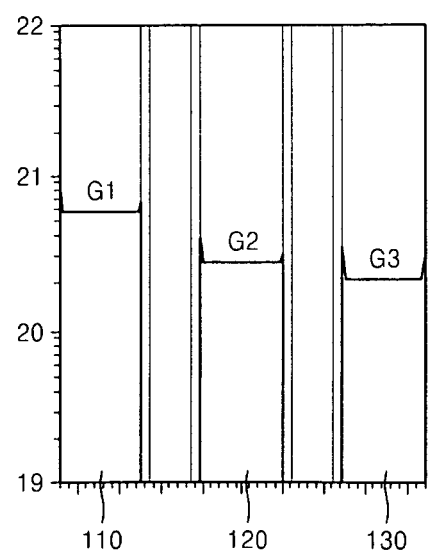
Figure 11C:
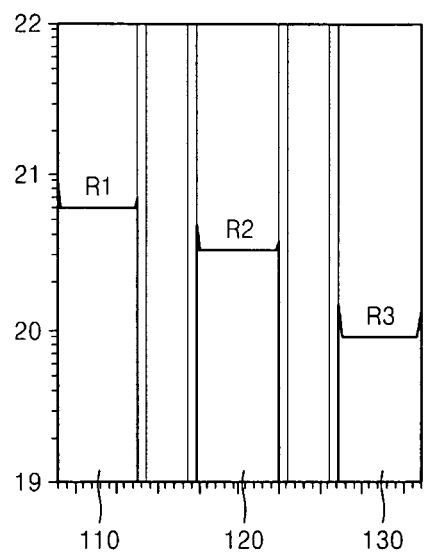

FIGS. 11A through 11C illustrate photoelectron generation rates at the first through third light-sensing layers 110, 120, and 130 according to wavelengths of light incident on the image sensor 100 of FIG. 1. In FIGS. 11A through 11C, the vertical axis represents a photoelectron generation rate per $scm^3$. For example, the value "20" in the vertical axis means $10^{20}/scm^3$. In FIGS. 11A through 110C, the horizontal axis represents locations of the first through third light-sensing layers 110, 120, and 130.

Referring to FIG. 11A, photoelectron generation rates for light having blue wavelengths at the first through third light-sensing layers 110, 120, and 130 are respectively $B_1$, $B_2$, and $B_3$. Referring to FIG. 11B, photoelectron generation rates for light having green wavelengths at the first through third light-sensing layers 110, 120, and 130 are respectively $G_1$, $G_2$, and $G_3$. Referring to FIG. 11C, photoelectron generation rates for light having red wavelengths at the first through third light-sensing layers 110, 120, and 130 are respectively $R_1$, $R_2$, and $R_3$. The photoelectron generation rates $B_1$, $B_2$, $B_3$, $G_1$, $G_2$, $G_3$, $R_1$, $R_2$, and $R_3$ may vary according to characteristics of the light-sensitive transparent oxide semiconductor transistors used in the first through third light-sensing layers 110, 120, and 130, and characteristics of the first and second filter layers 140 and 150. Accordingly, after the image sensor 100 is manufactured, the photoelectron generation rates $B_1$, $B_2$, $B_3$, $G_1$, $G_2$, $G_3$, $R_1$, $R_2$, and $R_3$ of the image sensor 100 may be previously obtained through experiments.

If the photoelectron generation rates $B_1$, $B_2$, $B_3$, $G_1$, $G_2$, $G_3$, $R_1$, $R_2$, and $R_3$ may be previously obtained through experiments, the intensity of light having a specific wavelength incident on the image sensor 100 may be obtained based on the photoelectron generation rates $B_1$, $B_2$, $B_3$, $G_1$, $G_2$, $G_3$, $R_1$, $R_2$, and $R_3$. For example, if output currents from the first through third light-sensing layers 110, 120, and 130 are respectively $I_1$, $I_2$, and $I_3$, and intensities of light having blue, green, and red wavelengths among the light incident on the image sensor 100 are respectively $C_B$, $C_G$, and $C_R$, Equation 1 may be obtained.

$$I_1 = C_B B_1 + C_G G_1 + C_R R_1$$
$$I_2 = C_B B_2 + C_G G_2 + C_R R_2$$
$$I_3 = C_B B_3 + C_G G_3 + C_R R_3 \quad \text{[Equation 1]}$$

From Equation 1, the intensities $C_B$, $C_G$, and $C_R$ of the light having the blue, green, and red wavelengths may be obtained. For example, the intensity $C_G$ of the light having the green wavelengths may be obtained by Equation 2.

$$C_G = \frac{I_2 - \frac{I_1 R_3 - R_1 I_3}{B_1 R_3 - R_1 B_3}\left(B_2 - \frac{B_3 R_2}{R_3}\right) - \frac{R_2 I_3}{R_3}}{G_2 - \frac{R_2 G_3}{R_3} - \frac{G_1 R_3 - R_1 G_3}{B_1 R_3 - R_1 B_3}} \quad \text{[Equation 2]}$$

Similarly, the intensity $C_B$ of the light having the blue wavelengths and the intensity $C_R$ of the light having the red wavelengths may be obtained. Accordingly, colors of light incident on the image sensor 100 constructed as described above may be exactly recognized through performing the method described above.

FIGS. 12A through 12F are plan views and cross-sectional views illustrating various non-limiting light-sensitive transparent oxide semiconductor transistors that may be used in the image sensor 100 of FIG. 1. Although each of the various light-sensitive transparent oxide semiconductor transistors of FIGS. 12A through 12F may be disposed on the third light-sensing layer 130 disposed on the substrate 101, each of the various light-sensitive transport oxide semiconductor transistors may also be disposed on the first and second light-sensing layers 110 and 120 respectively disposed between the first transparent insulating layer 115 and the second transparent insulating layer 115 and between the third transparent insulating layer 115 and the fourth transparent insulating layer 115.

Figure 12A:
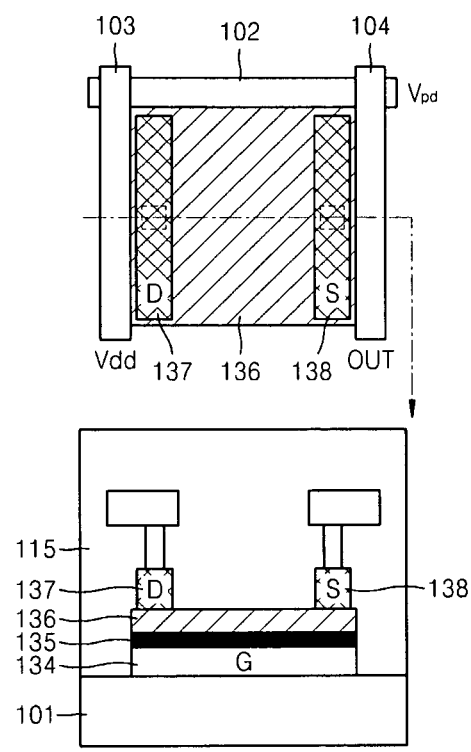
Figure 12B:
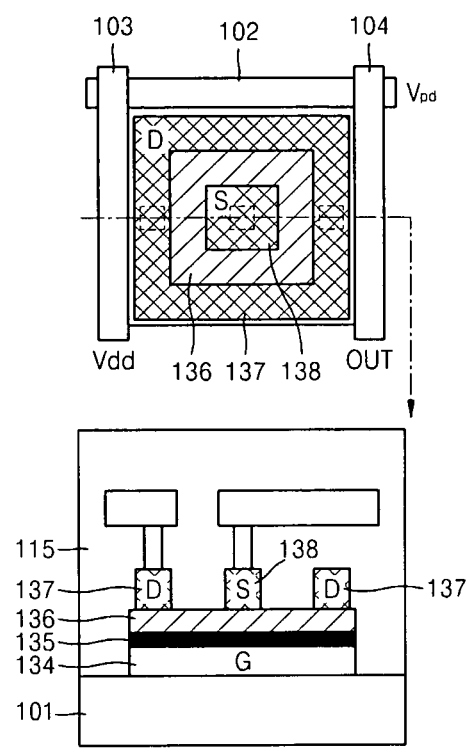

FIGS. 12A through 12C illustrate bottom gate-type light-sensitive transparent oxide semiconductor transistors. Referring to the lower illustration of FIG. 12A, a gate electrode 134, a gate insulating layer 135, and a light-sensitive transparent oxide semiconductor layer (referred to as an oxide semiconductor layer) 136 may be sequentially stacked on the substrate 101. A drain electrode 137 and a source electrode 138 may be formed on opposite sides of the oxide semiconductor layer 136. A transparent insulating layer 115 may completely surround the light-sensitive transparent oxide semiconductor transistor. The drain electrode 137 may be electrically connected to the power line 103, the source electrode 138 may be connected to the output line 104, and the gate electrode 134 may be connected to the gate signal line 102. Referring to the upper illustration of FIG. 12A, each of the drain electrode 137 and the source electrode 138 may have a straight bar shape, and the drain electrode 137 and the source electrode 138 may face each other in parallel so as to be disposed on opposite edges of the oxide semiconductor layer 136.

The light-sensitive transparent oxide semiconductor transistor of FIG. 12B may be the same as the light-sensitive transparent oxide semiconductor transistor of FIG. 12A except for the shape of each of the drain electrode 137 and the source electrode 138. Referring to the upper illustration of FIG. 12B, the drain electrode 137 may have a square shape and may be formed along an outer circumference of the oxide semiconductor layer 136, and the source electrode 138 may be formed on the oxide semiconductor layer 136 inside the drain electrode 137. Stated more clearly, the drain electrode 137 may surround the source electrode 138 with a predetermined interval therebetween. In this case, a gate length may be reduced, and a signal delay may be reduced.

The light-sensitive transparent oxide semiconductor transistor of FIG. 12C may be the same as the light-sensitive transparent oxide semiconductor transistor of FIG. 12A except for the shape of each of the drain electrode 137 and the source electrode 138. Referring to the upper illustration of FIG. 12C, the drain electrode 137 may have ⊂-like shape and may be formed along three sides of the oxide semiconductor layer 136, and the source electrode 138 may be formed on the oxide semiconductor layer 136 inside the drain electrode 137. Stated more clearly, the drain electrode 137 may surround three side surfaces of the source electrode 138 with a predetermined interval therebetween. In this case, a gate length may be reduced, and a signal delay may be reduced. Also, the area of light incident on the oxide semiconductor layer 136 of FIG. 12C may be greater than that of FIG. 12B.

Figure 12D:
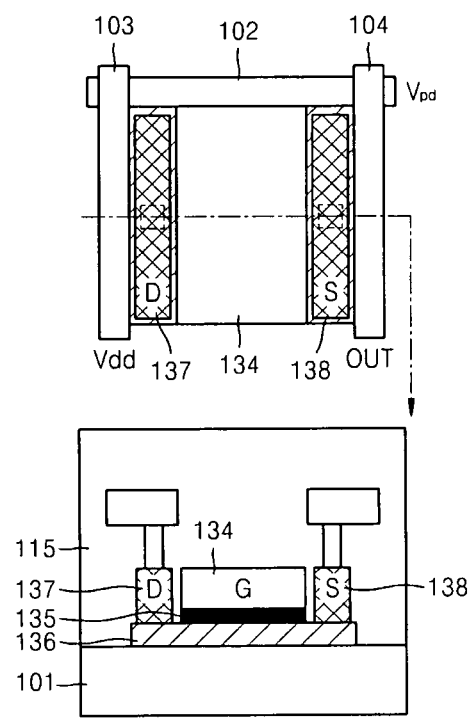
Figure 12E:
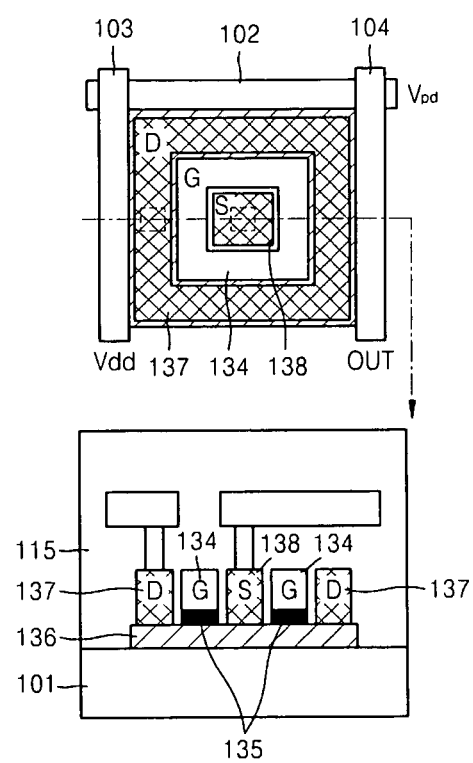
Figure 12F:
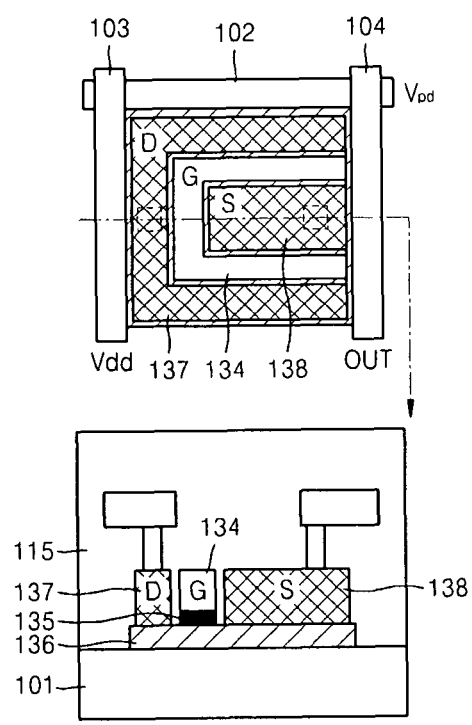

FIGS. 12D through 12F illustrate top gate-type light-sensitive transparent oxide semiconductor transistors. Referring to the lower illustration of FIG. 12D, the light-sensitive transparent oxide semiconductor layer 136 may be formed on the substrate 101, and the gate insulating layer 135 and the gate electrode 134 may be partially stacked on the oxide semiconductor layer 136. The drain electrode 137 and the source electrode 138 may be formed on opposite sides of the oxide semiconductor layer 136. The transparent insulating layer 115 may completely surround the light-sensitive transparent oxide semiconductor transistor. As described above, the drain electrode 137 may be electrically connected to the power line 103, and the source electrode 138 may be electrically connected to the output line 104. The gate electrode 134 may be connected to the gate signal line 102. Referring to the upper illustration of FIG. 12D, each of the drain electrode 137 and the source electrode 138 may have a straight bar shape, and the drain electrode 137 and the source electrode 138 may face each other in parallel to be disposed on opposite edges of the oxide semiconductor layer 136.

The light-sensitive transparent oxide semiconductor transistor of FIG. 12E may be the same as the light-sensitive transparent oxide semiconductor transistor of FIG. 12A except for the shape of each of the gate electrode 134, the drain electrode 137, and the source electrode 138. Referring to the upper illustration of FIG. 12E, the drain electrode 137 may have a square shape and may be formed along an outer circumference of the oxide semiconductor layer 136. The gate electrode 134 may have a square shape and may be formed along an inner circumference of the drain electrode 137. The source electrode 138 may be formed on the oxide semiconductor layer 136 inside the gate electrode 134. Stated more clearly, the drain electrode 137 may surround the gate electrode 134 with a predetermined interval therebetween. The gate electrode 134 may surround the source electrode 138 with a predetermined interval therebetween. In this case, a gate length may be reduced, and a signal delay may be reduced.

The light-sensitive transparent oxide semiconductor transistor of FIG. 12F may be the same as the light-sensitive transparent oxide semiconductor transistor of FIG. 12A except for the shape of each of the gate electrode 134, the drain electrode 137, and the source electrode 138. Referring to the upper illustration of FIG. 12F, the drain electrode 137 may have a ⊂-like shape and may be formed along three sides of the oxide semiconductor layer 136. The gate electrode 134 may have a ⊂-like shape and may be formed along inner three sides of the drain electrode 137. The source electrode 138 may be formed on the oxide semiconductor layer 136 inside the gate electrode 134. Stated more clearly, the drain electrode 137 may surround three side surfaces of the gate electrode 134 with a predetermined interval therebetween. The gate electrode 134 may surround three side surfaces of the source electrode 138 with a predetermined interval therebetween.

Although it has been described that the image sensor 100 may include a plurality of light-sensing layers formed of light-sensitive transparent oxide semiconductor materials stacked in one pixel cell, the image sensor 100 may include only one light-sensing layer.

Figure 13:
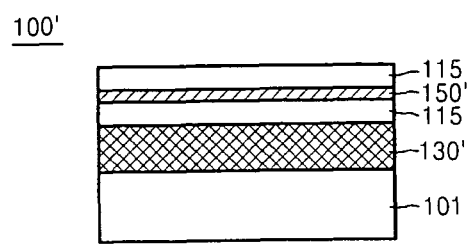
FIG. 13 is a cross-sectional view of another image sensor using a light-sensitive transparent oxide semiconductor material as a light-sensing layer according to example embodiments.

FIG. 13 is a cross-sectional view of another image sensor 100' using a light-sensitive transparent oxide semiconductor material as a light sensor (e.g., light-sensing layer) according to example embodiments. Referring to FIG. 13, the image sensor 100' may include a light-sensing layer 130', a first insulating layer 115, a filter layer 150', and a second insulating layer 115 sequentially stacked on the substrate 101. Accordingly, the image sensor 100' of FIG. 13 may be different from the image sensor 100 of FIG. 1 in that the image sensor 100' of FIG. 13 includes only the third light-sensing layer 130 and the second filter layer 150 of FIG. 1. For example, the image sensor 100' may be a single color image sensor for detecting only a specific color according to the filter layer 150'. Alternatively, the image sensor 100' may be used only to measure the intensity of incident light irrespective of colors. The light-sensing layer 130' may have the same structure as that of each of the first through third light-sensing layers 110, 120, and 130 and each of the lines 102, 103, and 104. A plurality of image sensor cells having such a structure as shown in FIG. 13 may be arranged in a 2-D manner in a unit pixel to detect a color.

Figure 14:
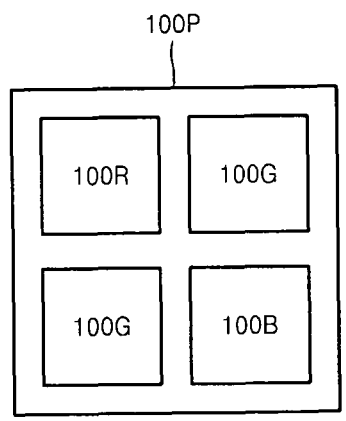
FIG. 14 illustrates a plurality of image sensor cells of the image sensor of FIG. 13 which are arranged in a unit pixel to detect a color.

FIG. 14 illustrates a plurality of image sensor cells 100R, 100G, and 100B of the image sensor 100' of FIG. 13 which are arranged in a unit pixel 100P. Referring to FIG. 14, four image sensor cells 100R, 100G, and 100B may be arranged in one unit pixel 100P. For example, two green image sensor cells 100G may be arranged in one diagonal direction, and a red image sensor cell 100R and a blue image sensor cell 100B may be arranged in the other diagonal direction. In this case, the filter layer 150' in the green image sensor cell 100G may be a red color filter, and the filter layer 150' in the red image sensor cell 100R may be a blue color filter.

An image sensor using a light-sensitive transparent oxide semiconductor material has been particularly shown and described with reference to various non-limiting example embodiments. The image sensor may be applied to a digital camera, a camcorder, a mobile phone, a portable electronic device, although example embodiments are not limited thereto.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. An image sensor comprising:
   at least one light-sensitive oxide semiconductor layer as a light-sensing layer;
   a first transparent insulating layer and a second transparent insulating layer on the at least one light-sensitive oxide semiconductor layer; and
   at least one filter layer between the first and second transparent insulating layers, the at least one filter layer directly contacting at least one of the first and second transparent insulating layers.

2. The image sensor of claim 1, wherein the at least one light-sensitive oxide semiconductor layer is in a form that includes a plurality of light-sensing layers stacked on different levels.

3. The image sensor of claim 1, wherein the at least one filter layer is in a form that includes
   a first filter layer and a second filter layer, and
   wherein the at least one light-sensitive oxide semiconductor layer is in a form that includes a first light-sensing layer, a second light-sensing layer, and a third light-sensing layer, and the first light-sensing layer, first filter layer, second light-sensing layer, second filter layer, and third light-sensing layer are sequentially stacked from a side of the image sensor on which light is incident.

4. The image sensor of claim 3, wherein
   the first and second transparent insulating layers are disposed between the first light-sensing layer and the second light-sensing layer and between the second light-sensing layer and the third light-sensing layer.

5. The image sensor of claim 3, further comprising:
   a lens device on the first light-sensing layer.

6. The image sensor of claim 5, wherein the lens device focuses blue light on the first light-sensing layer, focuses green light on the second light-sensing layer, and focuses red light on the third light-sensing layer by using chromatic aberration.

7. The image sensor of claim 3, wherein the first filter layer blocks light having blue wavelengths and transmits light having wavelengths other than blue wavelengths, and the second filter layer blocks light having green wavelengths and transmits light having wavelengths other than green wavelengths or transmits light having red wavelengths and blocks light having wavelengths other than red wavelengths.

8. The image sensor of claim 3, wherein each of the first and second filter layers includes a light absorption layer having a light absorption coefficient that varies according to wavelength.

9. The image sensor of claim 8, wherein the light absorption layer includes any one of amorphous silicon, crystalline silicon, Ge, GaAs, and $Ga_xIn_yS_2P$.

10. The image sensor of claim 8, wherein the light absorption layer of the first filter layer is thinner than the light absorption layer of the second filter layer.

11. The image sensor of claim 3, wherein the first filter layer is a blue complementary color filter that blocks light having blue wavelengths and transmits light having green and red wavelengths, and the second filter layer is a green complementary color filter that blocks light having green wavelengths and transmits light having blue and red wavelengths or is a red filter that transmits only light having red wavelengths.

12. The image sensor of claim 3, wherein the first filter layer is formed of any one of $TiO_x$, $SiO_x$, $Fe_2O_3$, cobalt (Co)-doped $ZnO_x$, and Co-doped $Al_2O_3$, and the second filter layer is formed of any one of $TiO_x$, $SiO_x$, $Fe_2O_3$, Co-doped $ZnO_x$, and Co-doped $Al_2O_3$.

13. The image sensor of claim 1, wherein the at least one light-sensitive oxide semiconductor layer is included in a light-sensitive transparent oxide semiconductor transistor having electrical characteristics that vary according to an amount of incident light.

14. The image sensor of claim 13, wherein the light-sensitive transparent oxide semiconductor transistor includes:
    a substrate;
    a gate electrode on the substrate;
    a gate insulating layer on the gate electrode;
    the at least one light-sensitive oxide semiconductor layer on the gate insulating layer; and
    a drain electrode and a source electrode on the at least one light-sensitive oxide semiconductor layer.

15. The image sensor of claim 14, wherein each of the gate electrode, the drain electrode, and the source electrode is formed of indium tin oxide (ITO) or indium zinc oxide (IZO).

16. The image sensor of claim 14, wherein each of the drain electrode and the source electrode has a straight bar shape, and the drain electrode and the source electrode are arranged in parallel on opposite sides of the at least one light-sensitive oxide semiconductor layer.

17. The image sensor of claim 14, wherein the drain electrode is formed along a periphery of the at least one light-sensitive oxide semiconductor layer so as to surround the source electrode.

18. The image sensor of claim 14, wherein the drain electrode is formed along three sides of the at least one light-sensitive oxide semiconductor layer so as to partially enclose the source electrode.

19. The image sensor of claim 13, wherein the light-sensitive transparent oxide semiconductor transistor includes:
    a substrate;
    the at least one light-sensitive oxide semiconductor layer on the substrate;
    a gate insulating layer on the at least one light-sensitive oxide semiconductor layer;
    a gate electrode on the gate insulating layer; and
    a drain electrode and a source electrode on the at least one light-sensitive oxide semiconductor layer.

20. The image sensor of claim 19, wherein each of the drain electrode and the source electrode has a straight bar shape, and the drain electrode and the source electrode are arranged in parallel on opposite sides of the at least one light-sensitive oxide semiconductor layer.

21. The image sensor of claim 19, wherein the drain electrode is formed along a periphery of the at least one light-sensitive oxide semiconductor layer, and the gate electrode is formed along an inner perimeter of the drain electrode so as to surround the source electrode.

22. The image sensor of claim 19, wherein the drain electrode is formed along three sides of the at least one light-sensitive oxide semiconductor layer, and the gate electrode is formed along an inner boundary of the drain electrode so as to partially enclose the source electrode.

23. The image sensor of claim 19, wherein the gate insulating layer is partially disposed on the at least one light-sensitive oxide semiconductor layer.

24. The image sensor of claim 13, further comprising:
    a gate signal line connected to gate electrodes of a plurality of the light-sensitive transparent oxide semiconductor transistors,
    a power line connected to drain electrodes of the plurality of light-sensitive transparent oxide semiconductor transistors, and
    output lines connected to source electrodes of the plurality of light-sensitive transparent oxide semiconductor transistors.

25. The image sensor of claim 1, wherein the at least one light-sensitive oxide semiconductor layer is formed of indium zinc oxide (InZnO) or gallium indium zinc oxide (GaInZnO).

26. The image sensor of claim 1, further comprising:
    a plurality of image sensor cells arranged in a two-dimensional (2-D) manner,
    wherein each of the plurality of image sensor cells includes:
    a substrate;
    the light-sensing layer on the substrate; and
    a filter layer on the light-sensing layer.

27. The image sensor of claim 26, wherein the plurality of image sensor cells are disposed in one unit pixel and include different color filters as filter layers.

28. The image sensor of claim 26, wherein the light-sensing layer is included in a light-sensitive transparent oxide semiconductor transistor having electrical characteristics that vary according to an amount of incident light.

29. The image sensor of claim 28, wherein the light-sensitive transparent oxide semiconductor transistor includes:
    a gate electrode on the substrate;
    a gate insulating layer on the gate electrode;
    the light sensing layer on the gate insulating layer; and
    a drain electrode and a source electrode on the light sensing layer.

30. The image sensor of claim 1, wherein the at least one light-sensitive oxide semiconductor layer has light-transmitting properties.

31. The image sensor of claim 1, wherein the at least one light-sensitive oxide semiconductor layer is transparent.

32. The image sensor of claim 1, wherein the at least one light-sensitive oxide semiconductor layer is in a form that includes a plurality of light-sensing layers stacked in one unit pixel region.

33. The image sensor of claim 1, wherein the at least one filter layer directly contacts both the first and second transparent insulating layers.

34. The image sensor of claim 1, wherein the at least one filter layer does not directly contact the at least one light-sensitive oxide semiconductor layer.

* * * * *